(12) United States Patent
Yang et al.

(10) Patent No.: US 12,313,677 B2
(45) Date of Patent: May 27, 2025

(54) PRESSURIZING DEVICE FOR SEMICONDUCTOR TESTING AND SEMICONDUCTOR TEST DEVICE INCLUDING THE SAME

(71) Applicant: SAMSUNG ELECTRONICS CO., LTD., Suwon-si (KR)

(72) Inventors: Changgeun Yang, Hwaseong-si (KR); Youbi Kim, Uijeongbu-si (KR); Sanghun Lee, Hwaseong-si (KR); Sangsik Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 395 days.

(21) Appl. No.: 18/077,496

(22) Filed: Dec. 8, 2022

(65) Prior Publication Data

US 2023/0221366 A1    Jul. 13, 2023

(30) Foreign Application Priority Data

Jan. 7, 2022    (KR) .................. 10-2020-0002524

(51) Int. Cl.
*G01R 31/28* (2006.01)
*G01R 1/04* (2006.01)

(52) U.S. Cl.
CPC ....... *G01R 31/2893* (2013.01); *G01R 1/0433* (2013.01)

(58) Field of Classification Search
CPC .............. G01R 31/2893; G01R 1/0433; G01R 31/2891; G01R 1/0466; G01R 31/2887; G01R 31/2867; G01R 31/2889
See application file for complete search history.

(56) References Cited

U.S. PATENT DOCUMENTS

| | | | | |
|---|---|---|---|---|
| 5,227,717 A | * | 7/1993 | Tsurishima | G01R 1/04 324/756.05 |
| 6,152,744 A | | 11/2000 | Maeda | |
| 6,304,073 B1 | * | 10/2001 | Saito | G01R 31/01 324/757.04 |
| 6,445,203 B1 | * | 9/2002 | Yamashita | G01R 31/2874 324/750.08 |
| 2004/0113646 A1 | | 6/2004 | Yamashita | |
| 2006/0043990 A1 | * | 3/2006 | Sato | G01R 31/2893 324/762.01 |
| 2009/0015279 A1 | | 1/2009 | Cho | |

(Continued)

FOREIGN PATENT DOCUMENTS

| | | | | |
|---|---|---|---|---|
| CN | 101894777 A | * | 11/2010 | .......... G01R 1/0466 |
| EP | 0817559 | * | 1/1998 | |
| JP | H0971322 A | * | 3/1997 | |

(Continued)

*Primary Examiner* — Daniel R Miller
(74) *Attorney, Agent, or Firm* — Sughrue Mion, PLLC

(57) ABSTRACT

A pressurizing device for semiconductor testing includes a tension block, a first pusher block extending through the tension block, a base plate on the first pusher block, a second pusher block on the tension block and extending through the base plate, a first spring connected to each of the first pusher block and the second pusher block, a second spring connected to each of the tension block and the base plate, a press plate on the base plate, and a press shaft coupled to the press plate. The press shaft includes a shaft hole.

20 Claims, 6 Drawing Sheets

(56) References Cited

U.S. PATENT DOCUMENTS

2021/0302468 A1    9/2021  Oh et al.

FOREIGN PATENT DOCUMENTS

| | | | |
|---|---|---|---|
| JP | 4115023 | B2 | 7/2008 |
| JP | 4439151 | B2 | 3/2010 |
| KR | 10-0325038 | B1 | 3/2002 |
| KR | 10-2004-0015338 | A | 2/2004 |
| KR | 20070077365 | * | 2/2007 |
| KR | 10-2007-0077365 | A | 7/2007 |
| KR | 10-2012-0082116 | A | 7/2012 |
| KR | 10-1311735 | B1 | 9/2013 |
| KR | 10-1341566 | B1 | 12/2013 |
| KR | 20150014357 | A * | 2/2015 |
| KR | 20180053210 | A * | 5/2018 |

* cited by examiner

PRESSURIZING DEVICE FOR SEMICONDUCTOR TESTING AND SEMICONDUCTOR TEST DEVICE INCLUDING THE SAME

CROSS-REFERENCE TO RELATED APPLICATION

This application claims priority from Korean Patent Application No. 10-2022-0002524, filed on Jan. 7, 2022, in the Korean Intellectual Property Office, the present disclosure of which is incorporated herein by reference in its entirety.

BACKGROUND

1. Field

Embodiments of the present disclosure relate to a pressurizing device for semiconductor testing and a semiconductor test device including the same.

2. Description of the Related Art

In accordance with fineness of a semiconductor device, a semiconductor chip becomes gradually thinner. In spite of such a thickness variation of the semiconductor device, it is necessary to stably test the semiconductor chip. For stable testing of the semiconductor chip, electrical contact between the semiconductor chip and a test device is important. To this end, a variety of research is being conducted in order to enhance the contact force between the semiconductor chip and the test device. In addition, in order to stably test the semiconductor chip, technology for controlling a temperature of the semiconductor chip to be a predetermined temperature upon testing the semiconductor chip is needed.

SUMMARY

Example embodiments of the present disclosure provide a pressurizing device capable of achieving an enhancement in accuracy of a test by preforming direct transfer of heat to a semiconductor chip while uniformly applying pressure to the semiconductor chip, and a test device including the same.

According to embodiments of the present disclosure, a pressurizing device for semiconductor testing is provided. The pressurizing device includes: a tension block; a first pusher block extending through the tension block; a base plate on the first pusher block; a second pusher block on the tension block and extending through the base plate; a first spring connected to each of the first pusher block and the second pusher block; a second spring connected to each of the tension block and the base plate; a press plate on the base plate; and a press shaft coupled to the press plate, wherein the press shaft comprises a shaft hole.

According to embodiments of the present disclosure, a pressurizing device for semiconductor testing is provided. The pressurizing device includes: a tension block comprising a guide bar; a first pusher block extending through the tension block; a base plate on the first pusher block; a second pusher block on the tension block and extending through the base plate, the second pusher block coupled to the tension block; a plurality of first springs, each of the plurality of first springs connected to each of the first pusher block and the second pusher block; a plurality of second springs, each of the plurality of second springs connected to each of the tension block and the base plate; a press plate on the base plate; and a press shaft coupled to the press plate, wherein the press shaft comprises a shaft hole.

According to embodiments of the present disclosure, a semiconductor test device is provided. The semiconductor test device includes: a tester with a test board disposed thereon; a test socket disposed on the test board, the test socket configured to support a semiconductor chip laid thereon; and a handler comprising a pressurizing device disposed on the test socket. The pressurizing device includes: a tension block configured to be on the semiconductor chip; a first pusher block extending through the tension block; a base plate on the first pusher block; a second pusher block on the tension block and extending through the base plate; a first spring connected to each of the first pusher block and the second pusher block; a second spring connected to each of the tension block and the base plate; a press plate on the base plate; and a press shaft coupled to the press plate, wherein the press shaft comprises a shaft hole.

DETAILED DESCRIPTION

It will be understood that when an element is referred to as being "over," "above," "on," "below," "under," "beneath," "connected to" or "coupled to" another element, it can be directly over, above, on, below, under, beneath, connected or coupled to the other element or intervening elements may be present. In contrast, when an element is referred to as being "directly over," "directly above," "directly on," "directly below," "directly under," "directly beneath," "directly connected to" or "directly coupled to" another element, there are no intervening elements present.

Figure 1:
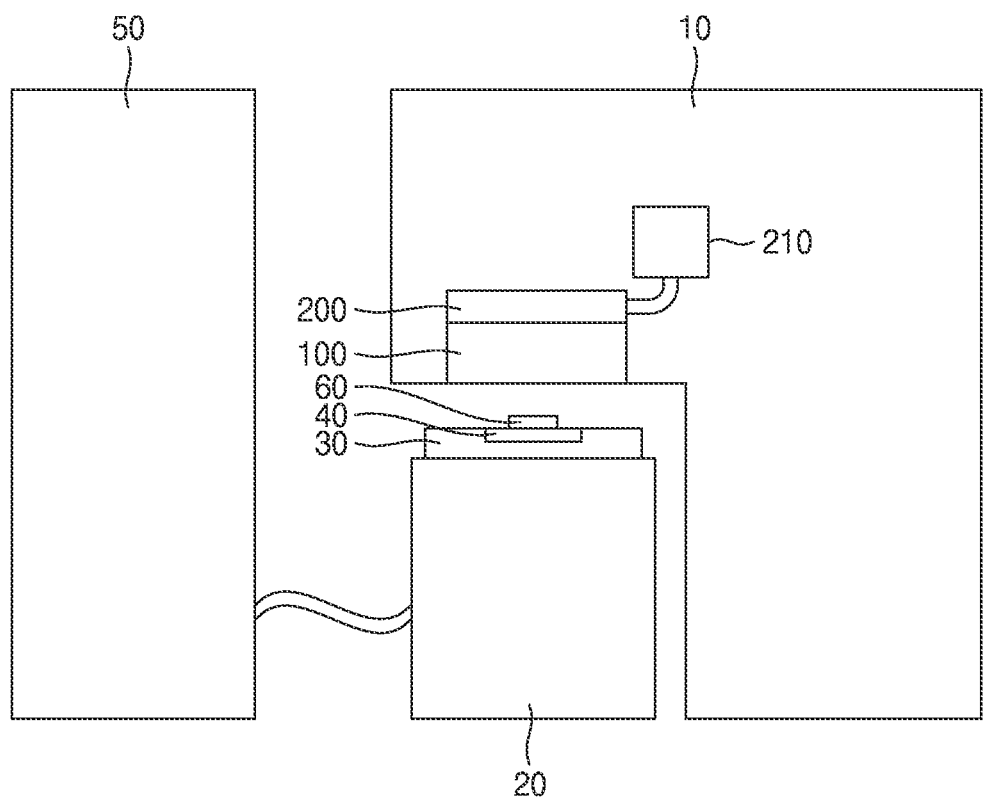
FIG. 1 is a view schematically showing a configuration of a semiconductor test device according to an example embodiment of the present disclosure.

FIG. 1 is a view schematically showing a configuration of a semiconductor test device according to an example embodiment of the present disclosure.

Referring to FIG. 1, the semiconductor test device may include a handler 10, a tester 20, a test board 30, a test socket 40, and a test server 50.

The handler 10 may load a semiconductor chip 60, which is an object to be tested, onto the test socket 40 disposed on the tester 20, may sort, after completion of a test, the semiconductor chip 60 in accordance with results of the test, and may then load the semiconductor chip 60 from the test socket 40 into a tray (not shown).

The tester 20 may be disposed adjacent to the handler 10. The tester 20 may be disposed under a chamber of the handler 10. The tester 20 may be electrically connected to the semiconductor chip 60 which is an object to be tested.

The test board 30 may be disposed on the tester 20. The tester 20 and the test board 30 may be electrically interconnected. The test socket 40 may be disposed on the test board 30. The test socket 40 may be electrically connected to the tester 20 via the test board 30. The semiconductor chip 60 may be disposed on the test socket 40, and may be electrically connected to the tester 20 via the test socket 40 and the test board 30.

The test server 50 may apply a predetermined input signal to the semiconductor chip 60 which is an object to be tested, and may receive an output signal output from the semiconductor chip 60. The test server 50 may recognize, from the output signal, whether or not the semiconductor chip 60 is good. For example, the test server 50 may be automatic test equipment (ATE). The test server 50 may apply an input signal to the semiconductor chip 60 and may receive an output signal from the semiconductor chip 60 via the tester 20, the test board 30, and the test socket 40.

The handler 10 may include a pressurizing device 100 for semiconductor testing. The pressurizing device 100 for semiconductor testing may be referred to as a "pressurizing device." The pressurizing device 100 may be disposed on the tester 20. The pressurizing device 100 may be disposed on the test board 30 and the test socket 40. The pressurizing device 100 may apply a predetermined pressure to the semiconductor chip 60 on the test socket 40 during testing.

The handler 10 may include a temperature supply duct 200. The temperature supply duct 200 may be disposed on the pressurizing device 100. The temperature supply duct 200 may contact the pressurizing device 100. The temperature supply duct 200 may be connected to a blower 210. The blower 210 may include a fan. The temperature supply duct 200 may be connected to a temperature controller and, as such, may be cooled or may generate heat. The blower 210 may blow air to the temperature supply duct 200 through the fan, and the temperature of the air blown to the temperature supply duct 200 may be varied in accordance with a temperature of the temperature supply duct 200.

Figure 2:
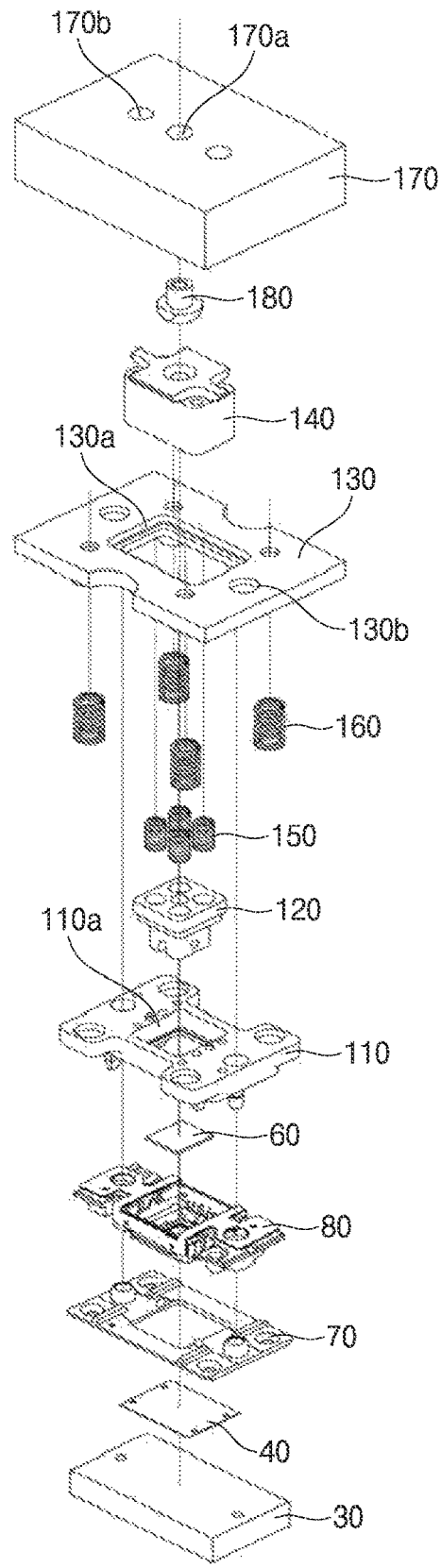
FIG. 2 is an exploded perspective view of a pressurizing device according to the example embodiment of the present disclosure.
Figure 3:
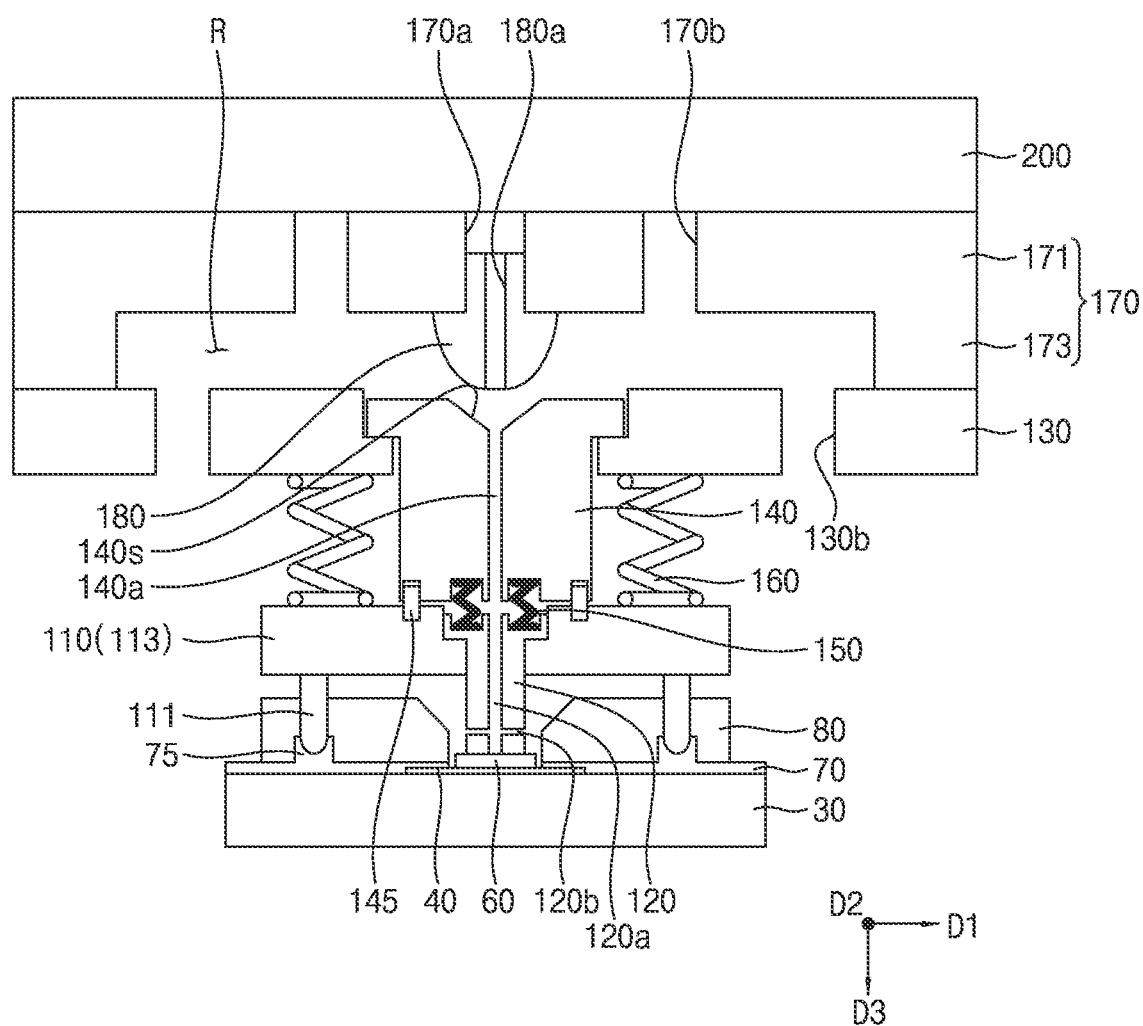
FIG. 3 is a schematic sectional view of the pressurizing device according to the example embodiment of the present disclosure.

FIG. 2 is an exploded perspective view of a pressurizing device according to the example embodiment of the present disclosure. FIG. 3 is a schematic sectional view of the pressurizing device according to the example embodiment of the present disclosure.

Referring to FIGS. 1 to 3, a pressurizing device 100 may include a tension block 110, a first pusher block 120, a base plate 130, a second pusher block 140, a first spring 150, a second spring 160, a press plate 170, and a press shaft 180.

The tension block 110 may be disposed on a test board 30. A test socket 40 and a socket guide 70 may be disposed on the test board 30. A semiconductor chip 60 may be laid on the test socket 40. An insert 80 may be disposed on the test socket 40. The semiconductor chip 60 may be disposed within the insert 80. The tension block 110 may be disposed on the semiconductor chip 60, the socket guide 70, and the insert 80. The socket guide 70 may guide a position of the test socket 40 on the test board 30. The socket guide 70 may guide a position of the tension block 110. The tension block 110 may include a base portion 113, and may further include a guide bar 111. The base portion 113 may have the form of a plate extending in a first direction D1 and a second direction D2. The guide bar 111 may be connected to the base portion 113, and may extend from a lower surface of the base portion 113 toward the test board 30. The guide bar 111 may be inserted into a guide portion 75 of the socket guide 70, and a position of the tension block 110 may be determined by coupling of the guide bar 111 and the guide portion 75.

The first pusher block 120 may be connected to the tension block 110. The first pusher block 120 may be coupled to the tension block 110. The tension block 110 may include a through portion 110a extending through the base portion 113, and the first pusher bock 120 may be inserted into the through portion 110a and, as such, may be coupled to the tension block 110. A part of an upper portion of the first pusher block 120 may be disposed within the base portion 113, and a lower portion of the first pusher block 120 may protrude under a lower surface of the tension block 110. The first pusher block 120 may be disposed on the semiconductor chip 60 disposed on the test socket 40. A lower surface of the first pusher block 120 may contact an upper surface of the semiconductor chip 60. The first pusher block 120 may include a vertical hole 120a and a horizontal hole 120b. The vertical hole 120a may extend through the first pusher block 120 in a vertical direction. The horizontal hole 120b may extend through the first pusher block 120 in a horizontal direction. The vertical hole 120a and the horizontal hole 120b may intersect each other.

The base plate 130 may be disposed on the tension block 110. The base plate 130 may have the form of a plate extending in horizontal directions (for example, the first direction D1 and the second direction D2). The base plate 130 may be spaced apart from the tension block 110 in a vertical direction (for example, a third direction D3). The base plate 130 may include a base hole 130a extending through the base plate 130. The base plate 130 may include a circulation hole 130b extending through the base plate 130.

The second pusher block 140 may be disposed on the first pusher block 120 and the tension block 110. The second pusher block 140 may be disposed to vertically overlap with the first pusher block 120. The second pusher block 140 may extend through the base plate 130. The second pusher block 140 may be inserted into the base hole 130a of the base plate 130 and, as such, may extend through the base plate 130. A part of an upper portion of the second pusher block 140 may be disposed within the base plate 130, and a lower portion of the base plate 130 may protrude under a lower surface of the base plate 130. The second pusher block 140 may be coupled to the tension block 110. The second pusher block 140 may be coupled to the tension block 110 through a fastener 145. The fastener 145 may interconnect the lower portion of the second pusher block 140 and an upper portion of the tension block 110. The second pusher block 140 may include a through hole 140a extending through the second pusher block 140 in a vertical direction (for example, the third direction D3). The through hole 140a may be vertically aligned with the vertical hole 120a of the first pusher block 120. The second pusher block 140 may include an inclined surface 140s. The inclined surface 140s may be formed at an upper portion of the second pusher block 140. The inclined surface 140s of the second pusher block 140 may interconnect an upper surface of the second pusher block 140 and an inner surface defining the through hole 140a.

The first spring 150 may be connected to each of the first pusher block 120 and the second pusher block 140. The first spring 150 may be connected, at a lower end thereof, to the first pusher block 120 while being connected, at an upper end thereof, to the second pusher block 120. A part of a lower portion of the first spring 150 may be inserted into the first pusher block 120, and a part of an upper portion of the first spring 150 may be inserted into the second pusher block 140. The first spring 150 may support the second pusher block 140 through elastic force thereof. For example, four of the first spring 150 may be provided, without being limited thereto.

The second spring 160 may be connected to each of the base plate 130 and the tension block 110. The second spring 160 may be connected, at a lower end thereof, to the tension block 110 while being connected, at an upper end thereof, to the base plate 130. The second spring 160 may support the base plate 130 through elastic force thereof. For example, four of the second spring 160 may be provided, without being limited thereto.

The press plate 170 may be disposed on the base plate 130. The press plate 170 may abut an upper surface of the base plate 130. The press plate 170 may include a plate portion 171 and an extension portion 173. The plate portion 171 may have the form of a plate extending in a horizontal direction, and the extension portion 173 may extend from a lower surface of the plate portion 171 toward the base plate 130. The extension portion 173 may extend along an edge of the plate portion 171 and, as such, may have a quadrangular ring shape when viewed in a plan view. The press plate 170 may include a recess R defined by the plate portion 171 and the extension portion 173. The recess R may be an empty space between the plate portion 171 and the base plate 130. The press plate 170 may include a circulation hole 170*b*. The press plate 170 may include an insertion hole 170*a*. A temperature supply duct 200 may be disposed on the press plate 170. A lower surface of the temperature supply duct 200 may contact an upper surface of the press plate 170. Although not shown, the press plate 170 may be connected to a driver including a motor through a shaft, and the press plate 170 may be vertically moved by the driver.

The press shaft 180 may be coupled to the press plate 170. The press shaft 180 may be inserted into the insertion hole 170*a* of the press plate 170 and, as such, may be coupled to the press plate 170. An upper portion of the press shaft 180 may be inserted into the insertion hole 170*a*, and a lower portion of the press shaft 180 may protrude under a lower surface of the plate portion 171. The lower portion of the press shaft 180 may be disposed in the recess R. The lower portion of the press shaft 180 may have a hemispherical shape. The cross-section of the lower portion of the press shaft 180 may have a semicircular shape. The press shaft 180 may include a shaft hole 180*a* vertically extending through the press shaft 180. The shaft hole 180*a* may be vertically aligned with the through hole 140*a* of the second pusher block 140. The shaft hole 180*a* may be vertically aligned with the vertical hole 120*a* of the first pusher block 120.

Figure 4:
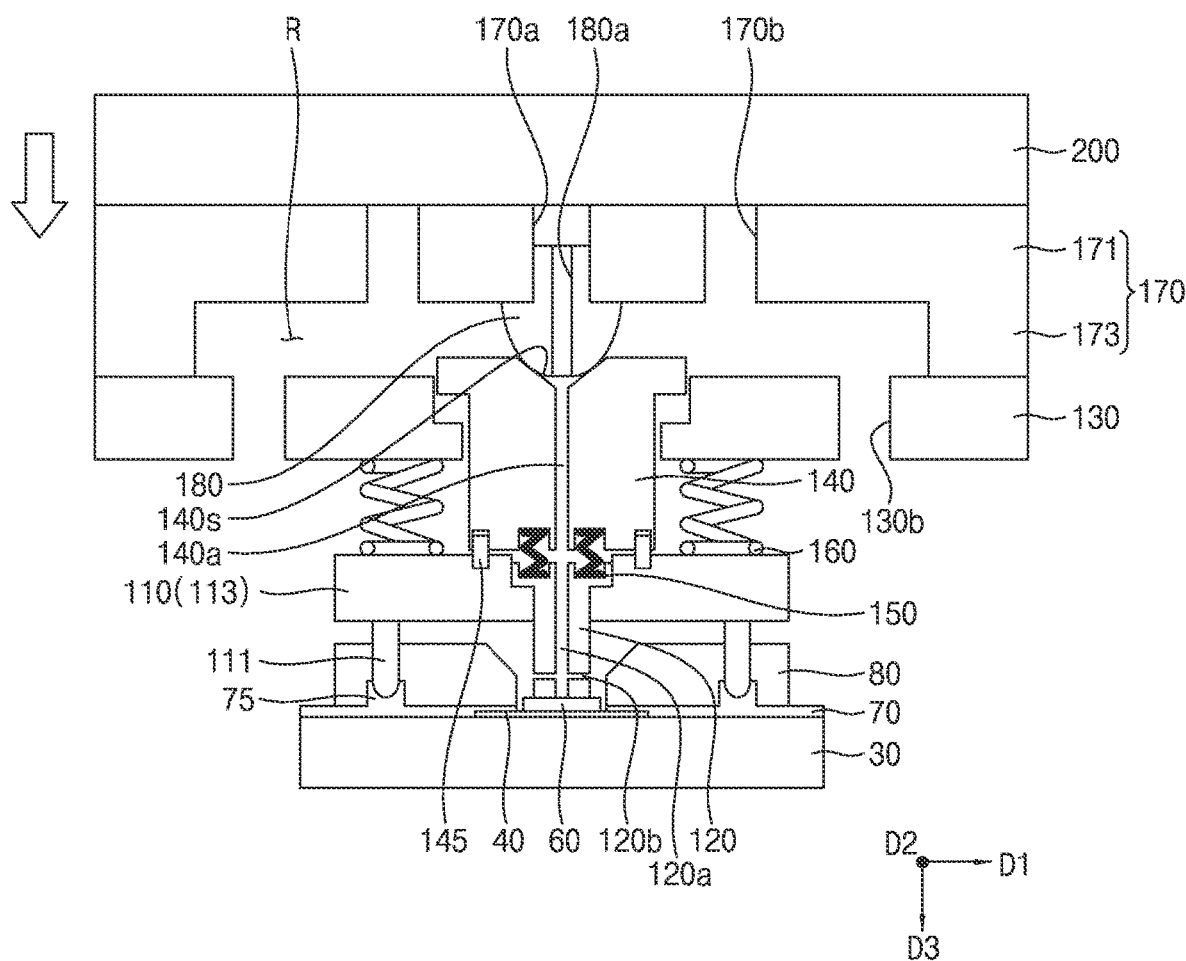
FIG. 4 is a first sectional view explaining operation of the pressurizing device of FIG. 3 according to an example embodiment.
Figure 5:
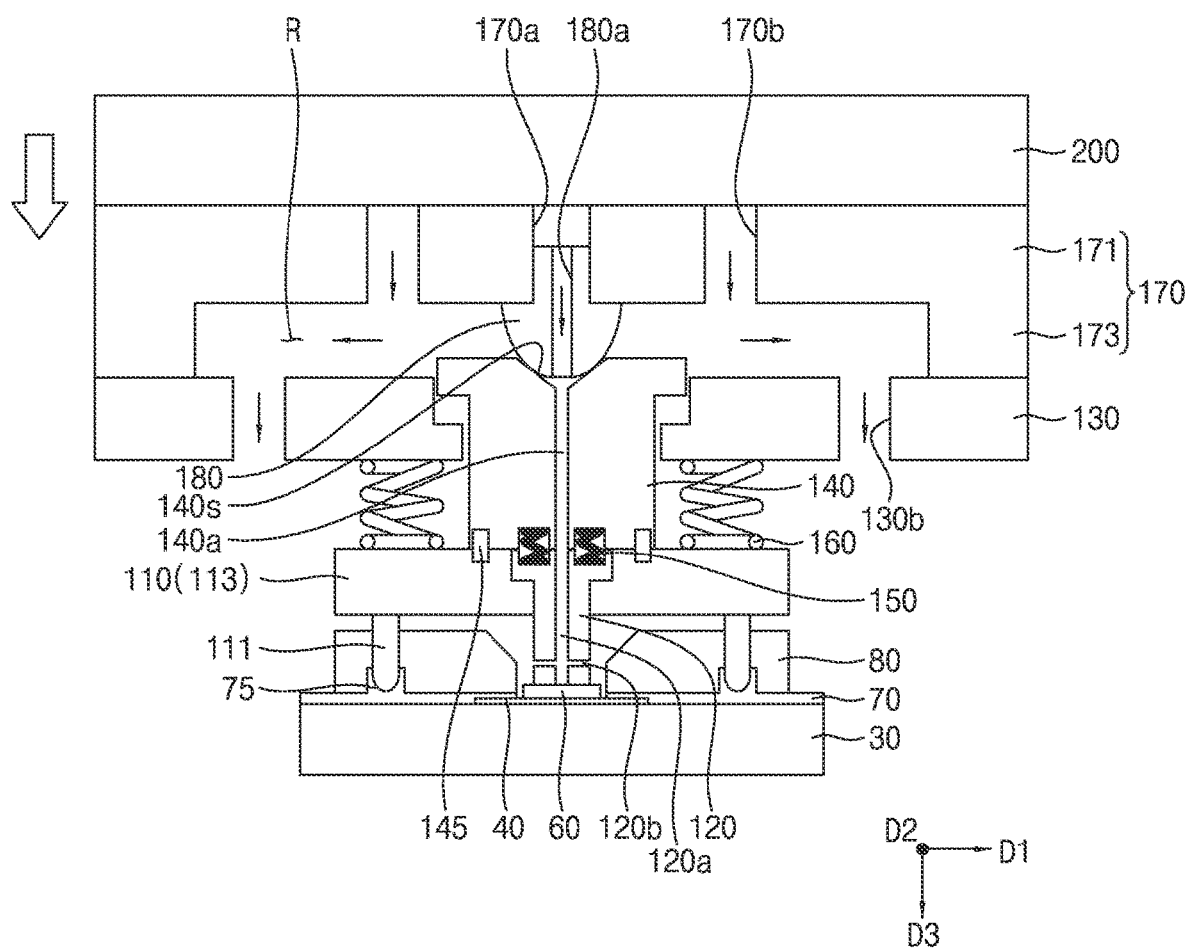
FIG. 5 is a second sectional view explaining operation of the pressurizing device of FIG. 3 according to an example embodiment.

FIGS. 4 and 5 are sectional views explaining operation of the pressurizing device of FIG. 3 according to an example embodiment.

Referring to FIGS. 4 and 5, the press plate 170 may move in a downward direction (for example, the third direction D3) toward the test board 30. The press plate 170 may be connected to a driver (not shown) of the handler 10 and, for example, the driver may include a motor. In accordance with control of the driver, the press plate 170 may press the base plate 130 while moving in the downward direction. The base plate 130 may be moved in the downward direction while being pushed by the press plate 170, and may press the second spring 160 in accordance with the downward movement thereof. As a result, the second spring 160 may be compressed. The second spring 160 may pressurize the tension block 110 through elastic force thereof. By the elastic force of the second spring 160, the tension block 110 may be moved in the downward direction. In accordance with movement of the tension block 110, the second pusher block 140 coupled to the tension block 110 may be pulled in the downward direction. As the second pusher block 140 is pulled in the downward direction, the second pusher block 140 may press the first spring 150. As a result, the first spring 150 may be compressed. The first spring 150 may pressurize the first pusher block 120 through elastic force thereof. The first pusher block 120 may pressurize the semiconductor chip 60 in the downward direction. As the first pusher block 120 pressurizes the semiconductor chip 60, electrical contact between the semiconductor chip 60 and the test socket 40 may be achieved.

As the press plate 170 moves in the downward direction, the press shaft 180 may also be moved in the downward direction and, as such, may come into contact with the second pusher block 140. The press shaft 180 may contact the inclined surface 140*s* of the second pusher block 140. As the press shaft 180 moves in the downward direction, the press shaft 180 may press the second pusher block 140. The second pusher block 140 may move in the downward direction and, as such, may press the first spring 150. As a result, the first spring 150 may be compressed. The first spring 150 may pressurize the first pusher block 120 through elastic force thereof. The first pusher block 120 may pressurize the semiconductor chip 60 in the downward direction. As the first pusher block 120 pressurizes the semiconductor chip 60, electrical contact between the semiconductor chip 60 and the test socket 40 may be achieved.

As described above, the tension block 110 may be pressed in accordance with downward movement of the press plate 170, and the second pusher block 140 may then primarily press the first spring 150 in accordance with the downward movement of the tension block 110. In addition, the second pusher block 140 may be pressed in accordance with downward movement of the press shaft 180, and the second pusher block 140 may then secondarily press the first spring 150. Accordingly, when the first spring 150 pressurizes the first pusher block 120 through the elastic force thereof, and the first pusher block 120 then pressurizes the semiconductor chip 60, the elastic force may have a sufficient magnitude such that electrical contact between the semiconductor chip 60 and the test socket 40 is achieved.

Referring to FIGS. 1 and 5, air heated or cooled through the temperature supply duct 200 may circulate around the semiconductor chip 60, thereby enabling the surroundings of the semiconductor chip 60 to have a temperature for testing of the semiconductor chip 60. Alternatively, air heated or cooled through the temperature supply duct 200 may circulate around the semiconductor chip 60, thereby enabling the semiconductor chip 60 to have a temperature for testing thereof. The temperature supply duct 200 may be connected to the blower 210 which includes a fan. By the blower 210, air may pass through the temperature supply duct 200, and may then move to the press plate 170. The air circulated by the blower 210 may pass through the circulation hole 170*b* of the press plate 170, and may then pass through the circulation hole 130*b* of the base plate 130 after passing through the recess R of the press plate 170. The air emerging from the base plate 130 may move to the surroundings of the semiconductor chip 60.

The air circulated by the blower 210 may pass through the insertion hole 170*a* of the press plate 170, and may then pass through the shaft hole 180*a* of the press shaft 180. The air emerging from the shaft hole 180*a* may pass through the through hole 140*a* of the second pusher block 140, and the vertical hole 120*a* and the horizontal hole 120*b* of the first pusher block 120 and, as such, may be directly provided to the semiconductor chip 60. As air heated or cooled by the temperature supply duct 200 is directly provided to the semiconductor chip 60, efficient heat transfer to the semiconductor chip 60 may be achieved. Accordingly, rapid and accurate temperature control for the semiconductor chip 60 in a semiconductor chip test procedure may be achieved.

Figure 6:
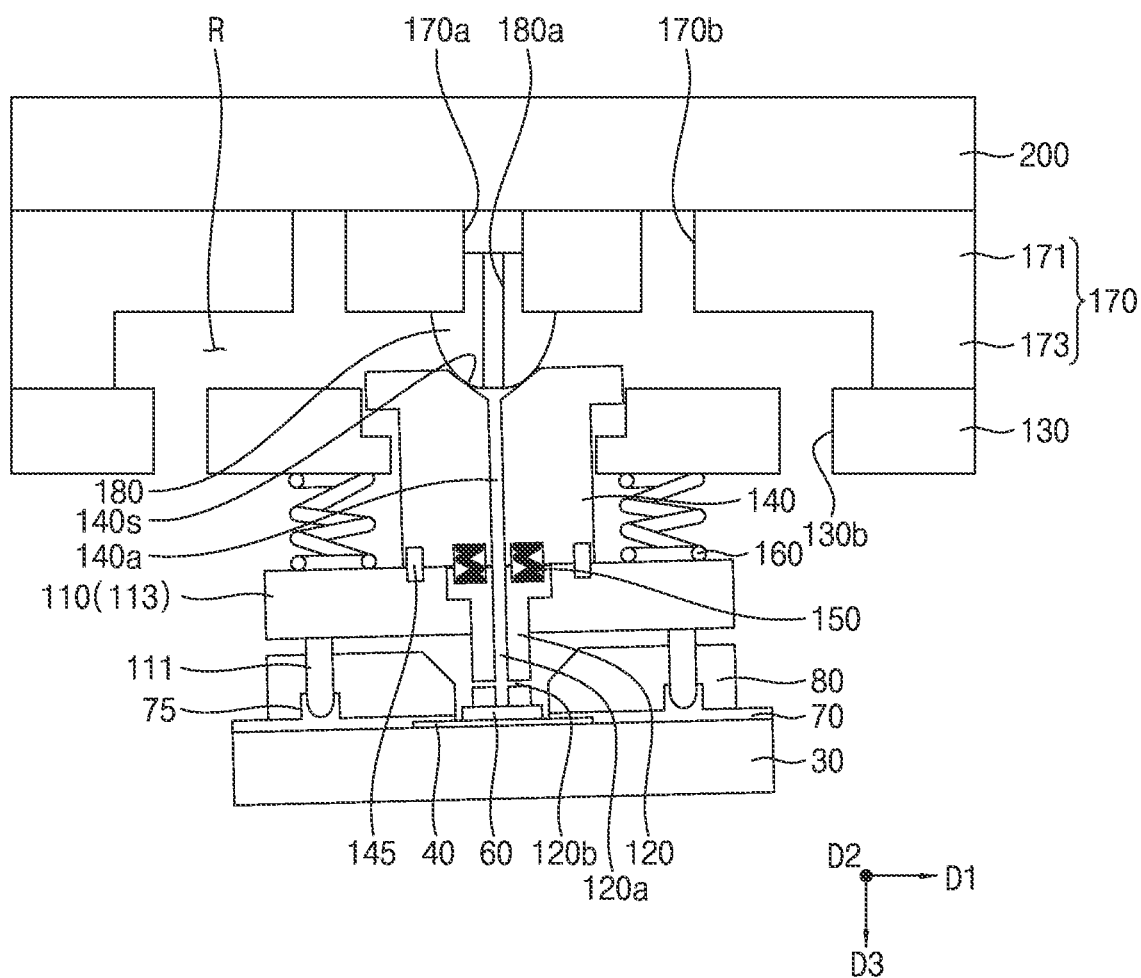
FIG. 6 is a sectional view explaining operation of the pressurizing device of FIG. 3 according to an embodiment.

FIG. 6 is a sectional view explaining operation of the pressurizing device of FIG. 3 according to an embodiment.

In an embodiment, the lower portion of the press shaft 180, which has a round surface, may linearly contact the inclined surface 140s of the second pusher block 140. Since the lower portion of the press shaft 180 has a hemispherical shape having a round surface, and linearly contacts the inclined surface 140s of the second pusher block 140, the second pusher block 140 may have freedom with respect to inclination. That is, the second pusher block 140 may be inclined such that a central axis thereof is not parallel to the third direction D3. The third direction D3 may be perpendicular to the ground. The third direction D3 may be perpendicular to a plane extending in the first direction D1 and the second direction D2. The first pusher block 120 and the tension block 110 may be connected to the second pusher block 140 and, as such, may be inclined together with the second pusher block 140.

In an embodiment, the test board 30 may be disposed not to be parallel to the ground. For example, the test board 30 may be disposed not to be parallel to the plane extending in the first direction D1 and the second direction D2. In this case, the test socket 40 and the semiconductor chip 60, which are disposed on the test board 30, may also be disposed not to be parallel to the ground. In this case, it is beneficial to make the tension block 110, the first pusher block 120, and the second pusher block 140 be parallel to the test socket 40 and the semiconductor chip 60 in order to apply uniform pressure to the semiconductor chip 60 on an area basis. That is, it may be beneficial to make each lower surface of the tension block 110, the first pusher block 120, and the second pusher block 140 be parallel to an upper surface of the test socket 40 and/or the upper surface of the semiconductor chip 60. When the first pusher block 120 contacts the upper surface of the semiconductor chip 60 which is disposed in an inclined state, the first pusher block 120 may be inclined such that the lower surface of the first pusher block 120 becomes parallel to the upper surface of the semiconductor chip 60. The lower surface of the first pusher bock 120 may completely abut the upper surface of the semiconductor chip 60. In accordance with inclination of the first pusher block 120, the tension block 110, and the second pusher block 140 may also be inclined. Inclination of the first pusher block 120, the tension block 110, and the second pusher block 140 may be achieved in that the press shaft 180 has a hemispherical shape having a round surface, and linearly contacts the inclined surface 140s of the second pusher block 140, as described above.

In accordance with example embodiments of the present disclosure, it is possible to provide a pressurizing device capable of uniformly applying pressure to a semiconductor chip on a test socket even when an inclination is generated between the pressurizing device and the test socket, and to provide a passage such that air for transferring heat to the semiconductor chip is directly provided to the semiconductor chip, thereby achieving rapid and accurate temperature control for the semiconductor chip, and to provide a test device including the pressurizing device. As a test for the semiconductor chip is performed through the pressurizing device and the test device, it is possible to enhance accuracy of results of a test for the semiconductor chip and to reduce a time taken for the test, thereby enhancing test efficiency.

While non-limiting example embodiments of the present disclosure have been described with reference to the accompanying drawings, it should be understood by those skilled in the art that various modifications may be made without departing from the scope of the present disclosure. Therefore, the above-described embodiments should be considered in a descriptive sense only and not for purposes of limitation.

What is claimed is:

1. A pressurizing device for semiconductor testing comprising:
   a tension block;
   a first pusher block extending through the tension block;
   a base plate on the first pusher block;
   a second pusher block on the tension block and extending through the base plate;
   a first spring connected to each of the first pusher block and the second pusher block;
   a second spring connected to each of the tension block and the base plate;
   a press plate on the base plate; and
   a press shaft coupled to the press plate,
   wherein the press shaft comprises a shaft hole that passes through a first end of the press shaft to a second end of the press shaft.

2. The pressurizing device according to claim 1, wherein the first pusher block comprises a horizontal hole and a vertical hole.

3. The pressurizing device according to claim 2, wherein the second pusher block comprises a through hole.

4. The pressurizing device according to claim 3, wherein the shaft hole, the vertical hole, and the through hole are vertically aligned with one another.

5. The pressurizing device according to claim 3, wherein the second pusher block further comprises an inclined surface interconnecting an inner surface, defining the through hole, and an upper surface of the second pusher block.

6. The pressurizing device according to claim 5, wherein the press shaft linearly contacts the inclined surface.

7. The pressurizing device according to claim 1, wherein the press shaft comprises a cross-section having a semicircular shape.

8. The pressurizing device according to claim 1, wherein:
   the press plate comprises a circulation hole; and
   the base plate comprises a circulation hole.

9. The pressurizing device according to claim 1, wherein the press shaft is configured to press the second pusher block, the second pusher block is configured to press the first spring, and the first pusher block is configured to be pressurized by elastic force of the first spring.

10. The pressurizing device according to claim 1, wherein the press plate is configured to press the base plate, the base plate is configured to press the second spring, the tension block is configured to be pressurized by elastic force of the second spring, the second pusher block is coupled to the tension block such that the second pusher block is configured to press the first spring based on the tension block being pressurized by the elastic force of the second spring, and the first pusher block is configured to be pressurized by elastic force of the first spring.

11. A pressurizing device for semiconductor testing comprising:
   a tension block comprising a guide bar;
   a first pusher block extending through the tension block;
   a base plate on the first pusher block;

a second pusher block on the tension block and extending through the base plate, the second pusher block coupled to the tension block;

a plurality of first springs, each of the plurality of first springs connected to each of the first pusher block and the second pusher block;

a plurality of second springs, each of the plurality of second springs connected to each of the tension block and the base plate;

a press plate on the base plate; and a press shaft coupled to the press plate, wherein the press shaft comprises a shaft hole that passes through a first end of the press shaft to a second end of the press shaft.

12. The pressurizing device according to claim 11, wherein the second pusher block is coupled to the tension block by a fastener.

13. The pressurizing device according to claim 11, wherein the guide bar is connected to a guide portion of a socket guide disposed under the tension block.

14. The pressurizing device according to claim 11, wherein the first pusher block comprises a vertical hole.

15. The pressurizing device according to claim 11, wherein the second pusher block comprises a through hole.

16. The pressurizing device according to claim 11, wherein the press shaft comprises a hemispherical shape.

17. The pressurizing device according to claim 11, wherein the press plate comprises a plate portion and an extension portion; and the press plate further comprises a recess defined by the plate portion and the extension portion.

18. A semiconductor test device comprising:

a tester with a test board disposed thereon;

a test socket disposed on the test board, the test socket configured to support a semiconductor chip laid thereon; and a handler comprising a pressurizing device disposed on the test socket, wherein the pressurizing device comprises:

a tension block configured to be on the semiconductor chip;

a first pusher block extending through the tension block;

a base plate on the first pusher block;

a second pusher block on the tension block and extending through the base plate;

a first spring connected to each of the first pusher block and the second pusher block;

a second spring connected to each of the tension block and the base plate;

a press plate on the base plate; and a press shaft coupled to the press plate, wherein the press shaft comprises a shaft hole that passes through a first end of the press shaft to a second end of the press shaft.

19. The semiconductor test device according to claim 18, wherein the first pusher block comprises a horizontal hole and a vertical hole; and the second pusher block comprises a through hole.

20. The semiconductor test device according to claim 18, wherein the press shaft is configured to press the second pusher block, the second pusher block is configured to press the first spring, the first pusher block is configured to be pressurized by elastic force of the first spring, and the first pusher block is configured to pressurize the semiconductor chip.

* * * * *